United States Patent
Oon et al.

(10) Patent No.: US 10,581,383 B2
(45) Date of Patent: Mar. 3, 2020

(54) DUAL-FEEDBACK AMPLIFIER LIMITER

(71) Applicant: MOTOROLA SOLUTIONS, INC., Chicago, IL (US)

(72) Inventors: Alexander Oon, Penang (MY); Teik Yang Goh, Penang (MY); Yuan Wei Ng, Penang (MY); Seow Teng Wong, Penang (MY)

(73) Assignee: MOTOROLA SOLUTIONS, INC., Chicago, IL (US)

( * ) Notice: Subject to any disclaimer, the term of this patent is extended or adjusted under 35 U.S.C. 154(b) by 0 days.

(21) Appl. No.: 15/779,176

(22) PCT Filed: Dec. 17, 2015

(86) PCT No.: PCT/MY2015/000103
§ 371 (c)(1),
(2) Date: May 25, 2018

(87) PCT Pub. No.: WO2017/105213
PCT Pub. Date: Jun. 22, 2017

(65) Prior Publication Data
US 2018/0351514 A1    Dec. 6, 2018

(51) Int. Cl.
*H03F 3/04* (2006.01)
*H03F 1/02* (2006.01)
(Continued)

(52) U.S. Cl.
CPC .......... *H03F 1/0272* (2013.01); *H03F 1/14* (2013.01); *H03F 1/22* (2013.01); *H03F 1/226* (2013.01);
(Continued)

(58) Field of Classification Search
CPC .......... H03F 1/0272; H03F 1/226; H03F 1/22; H03F 1/14; H03F 3/19; H03F 2200/294; H03F 2200/474; H03F 2200/18
(Continued)

(56) References Cited

U.S. PATENT DOCUMENTS

| 5,488,382 A | 1/1996 | Fenzi et al. |
| 6,292,060 B1 | 9/2001 | Yeo et al. |

(Continued)

FOREIGN PATENT DOCUMENTS

WO    2007/008042    1/2007

OTHER PUBLICATIONS

Motorola Solutions, "Mototrbo SL300 Portable Two-Way Radio, Portability and Simplicity Redefined," specifications(2017) 4 pages, Chicago USA (http://www.motorolasolutions.com/en_us/products/two-way-radios/mototrbo/portable-radios/sl300.html.
(Continued)

*Primary Examiner* — Khanh V Nguyen
*Assistant Examiner* — Khiem D Nguyen
(74) *Attorney, Agent, or Firm* — Michael Best & Friedrich LLP (57) ABSTRACT

A method and apparatus for a dual-feedback, amplifier limiter for providing a conditioned radio-frequency signal. The dual-feedback, amplifier limiter includes an input that receives a radio-frequency signal and a stacked amplifier including an input node coupled to the input, an output node, a first transistor configured as a common-base amplifier, and a second transistor configured as a common-emitter amplifier. The dual-feedback, amplifier limiter further includes an output coupled to the output node of the stacked amplifier. The output provides the conditioned radio-frequency signal. The dual-feedback, amplifier limiter further includes a radio-frequency feedback circuit coupled to the stacked
(Continued)

amplifier. The radio-frequency feedback circuit includes a passive radio-frequency dependent reactive element in series with a radio-frequency feedback circuit resistor. The dual-feedback, amplifier limiter further includes an envelope control feedback circuit coupled to the stacked amplifier and including a current mirror and a reactive element loop filter.

18 Claims, 9 Drawing Sheets

(51) Int. Cl.
　　　*H03F 3/19*　　　(2006.01)
　　　*H03F 1/22*　　　(2006.01)
　　　*H03F 1/14*　　　(2006.01)
(52) U.S. Cl.
　　　CPC ........... *H03F 3/19* (2013.01); *H03F 2200/18* (2013.01); *H03F 2200/294* (2013.01); *H03F 2200/474* (2013.01)

(58) Field of Classification Search
　　　USPC .......................................... 330/302, 296, 311
　　　See application file for complete search history.

(56) References Cited

U.S. PATENT DOCUMENTS

| | | |
|---|---|---|
| 7,193,475 B2 | 3/2007 | Su et al. |
| 8,037,598 B2 | 10/2011 | Sullivan |
| 8,493,154 B1 * | 7/2013 | Camargo ................ H03F 1/223 330/296 |
| 2004/0008082 A1 | 1/2004 | Dow |
| 2010/0127776 A1 | 5/2010 | Chow et al. |
| 2015/0263675 A1 | 9/2015 | Ding et al. |

OTHER PUBLICATIONS

PCT/MY2015/000103 International Search Report and Written Opinion of the International Searching Authority dated Sep. 6, 2016 (10 pages).

* cited by examiner

SIMPLIFIED EQUIVALENT
CIRCUIT

DUAL-FEEDBACK AMPLIFIER LIMITER

BACKGROUND OF THE INVENTION

Land mobile radios are used in many applications. In land mobile radio communication systems, characteristics such as increased range performance (i.e., sensitivity) and increased interference rejection are often desired. The ability to improve transmission power level and transmission antenna performance to increase these characteristics is limited in some circumstances. Additionally, techniques to increase range performance or interference rejection on a receiver of a land mobile radio can have performance tradeoffs.

BRIEF DESCRIPTION OF THE SEVERAL VIEWS OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION OF THE INVENTION

One embodiment provides a dual-feedback, amplifier limiter for providing a conditioned radio-frequency signal. The dual-feedback, amplifier limiter includes an input that receives a radio-frequency signal. The dual-feedback, amplifier limiter further includes a stacked amplifier including an input node coupled to the input, an output node, a first transistor configured as a common-base amplifier, and a second transistor configured as a common-emitter amplifier. The dual-feedback, amplifier limiter further includes an output coupled to the output node of the stacked amplifier. The output provides, from the stacked amplifier, the conditioned radio-frequency signal. The dual-feedback, amplifier limiter further includes a radio-frequency feedback circuit coupled to the stacked amplifier. The radio-frequency feedback circuit includes a passive radio-frequency dependent reactive element in series with a radio-frequency feedback circuit resistor. The dual-feedback, amplifier limiter further includes an envelope control feedback circuit coupled to the stacked amplifier and including a current mirror and a reactive element loop filter.

Some embodiments include a method of providing a conditioned radio-frequency signal. In one exemplary embodiment, the method includes receiving a radio-frequency signal at an input. The method further includes providing the radio-frequency signal at an input node of a stacked amplifier that includes a common-base amplifier and a common-emitter amplifier. The method further includes providing feedback, at the input node, from a radio-frequency feedback circuit and an envelope control feedback circuit to bias the radio-frequency signal to provide a biased radio-frequency signal to the stacked amplifier. The method further includes conditioning the radio-frequency signal, using the stacked amplifier, to produce the conditioned radio-frequency signal. The method further includes transmitting the conditioned radio-frequency signal to receiving circuitry at an output.

Figure 1:
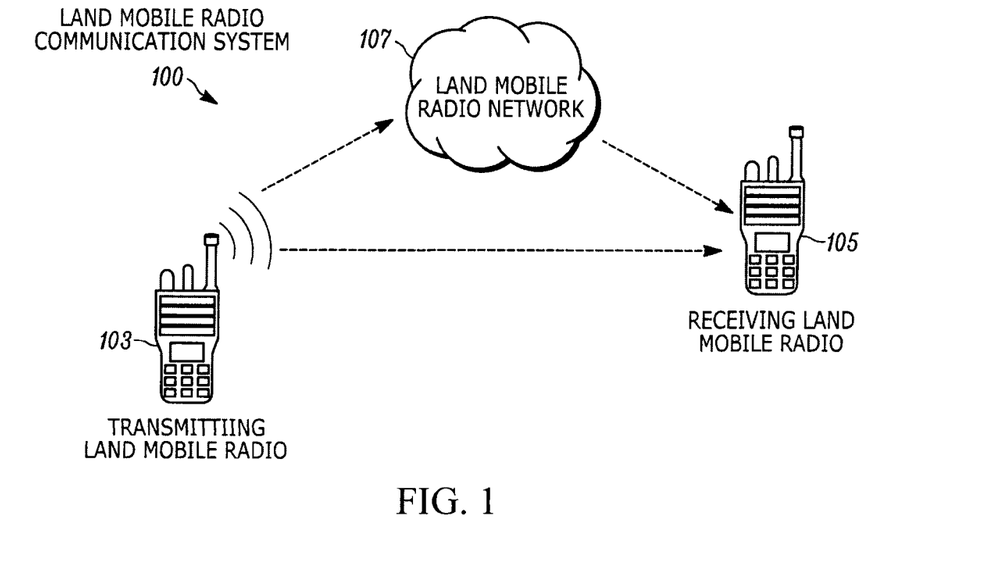
FIG. 1 illustrates a land mobile radio communication system according to one exemplary embodiment.

FIG. 1 illustrates a land mobile radio communication system 100 according to one exemplary embodiment. In FIG. 1, the land mobile radio communication system 100 includes a transmitting land mobile radio 103 and a receiving land mobile radio 105 that wirelessly communicate with each other over a land mobile radio (LMR) network 107. As indicated by the arrows in FIG. 1, in some embodiments, the land mobile radios 103 and 105 may communicate directly with each other. While FIG. 1 shows the land mobile radios 103 and 105 as portable communication devices (i.e., hand-held devices), other land mobile radios may be used in some embodiments including, for example, mobile communication devices installed/mounted in vehicles. Furthermore, while FIG. 1 shows the land mobile radio communication system 100, in other embodiments, other communication systems and networks, including, but not limited to, future developed networks, radio-to-vehicular mobile networks, wireless accessory Personal Area Networks (PAN), Machine-to-machine (M2M) autonomous networks, multi-protocol translation repeater systems, and any combination or derivative thereof, may be employed.

Figure 2:
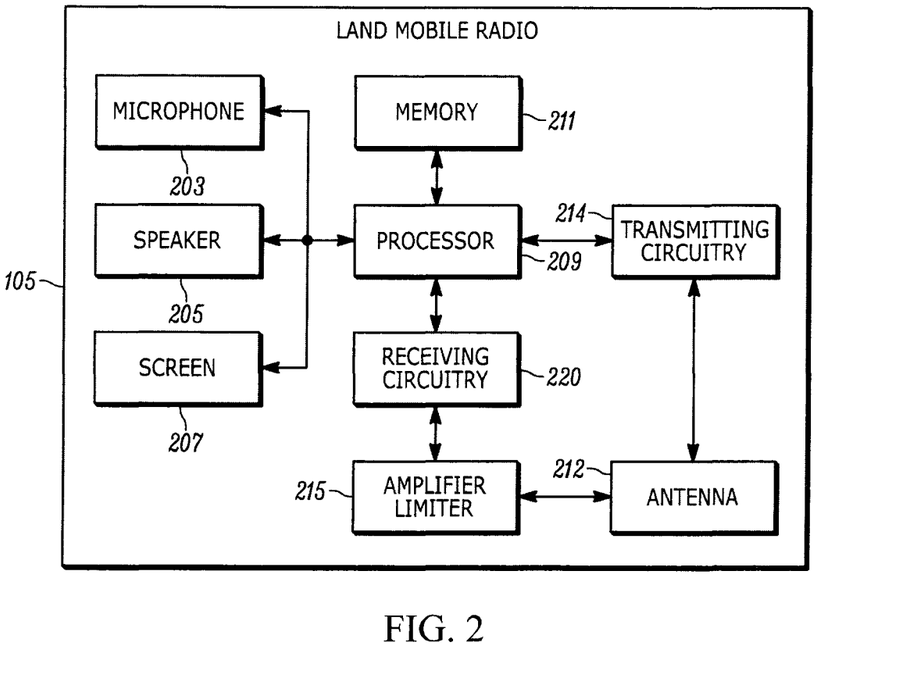
FIG. 2 illustrates a block diagram of a land mobile radio of the land mobile radio communication system according to one embodiment.

FIG. 2 illustrates a block diagram of the land mobile radio 105, which is also applicable to land mobile radio 103. The land mobile radio 105 includes user interface hardware such as a microphone 203, a speaker 205, and a display screen 207. A processor 209 receives input audio data from the microphone 203, provides output audio data to the speaker 205, and provides output visual data to the screen 207. The processor 209 is communicatively coupled to a memory 211 that stores data and instructions that are executable by the processor 209 to control the operation of the land mobile radio 105. The memory 211 includes one or more non-transitory computer-readable memory devices such as, for example, random access memory (RAM), read only memory (ROM), Flash memory, or optical/magnetic disk storage.

The land mobile radio 105 also includes an antenna 212 that allows the land mobile radio 105 to communicate wirelessly with other systems and devices. For example, the land mobile radio 105 is configured to communicate with other land mobile radios (e.g., the land mobile radio 103) by transmitting and receiving radio-frequency signals over the land mobile radio network 107. Transmitting circuitry 214 receives information from the processor 209 and performs signal conditioning before passing the information onto the antenna 212. The antenna 212 receives information to be transmitted from transmitting circuitry 214 and transmits a radio-frequency signal related to the information.

The antenna 212 also receives radio-frequency signals from other land mobile radios and provides the received radio-frequency signals to an amplifier limiter 215. The amplifier limiter 215 performs signal conditioning on the received radio-frequency signals, and provides a conditioned radio-frequency signal to the receiving circuitry 220 (i.e., single conversion receiving integrated circuits, power amplifiers, etc.). The receiving circuitry 220 can then provide further conditioned signals to the processor 209. While FIG. 2 shows a single antenna 212, in some embodiments, the land mobile radio 105 may have more than one antenna (e.g., one antenna for receiving radio-frequency signals and one antenna for transmitting radio-frequency signals).

Figure 3:
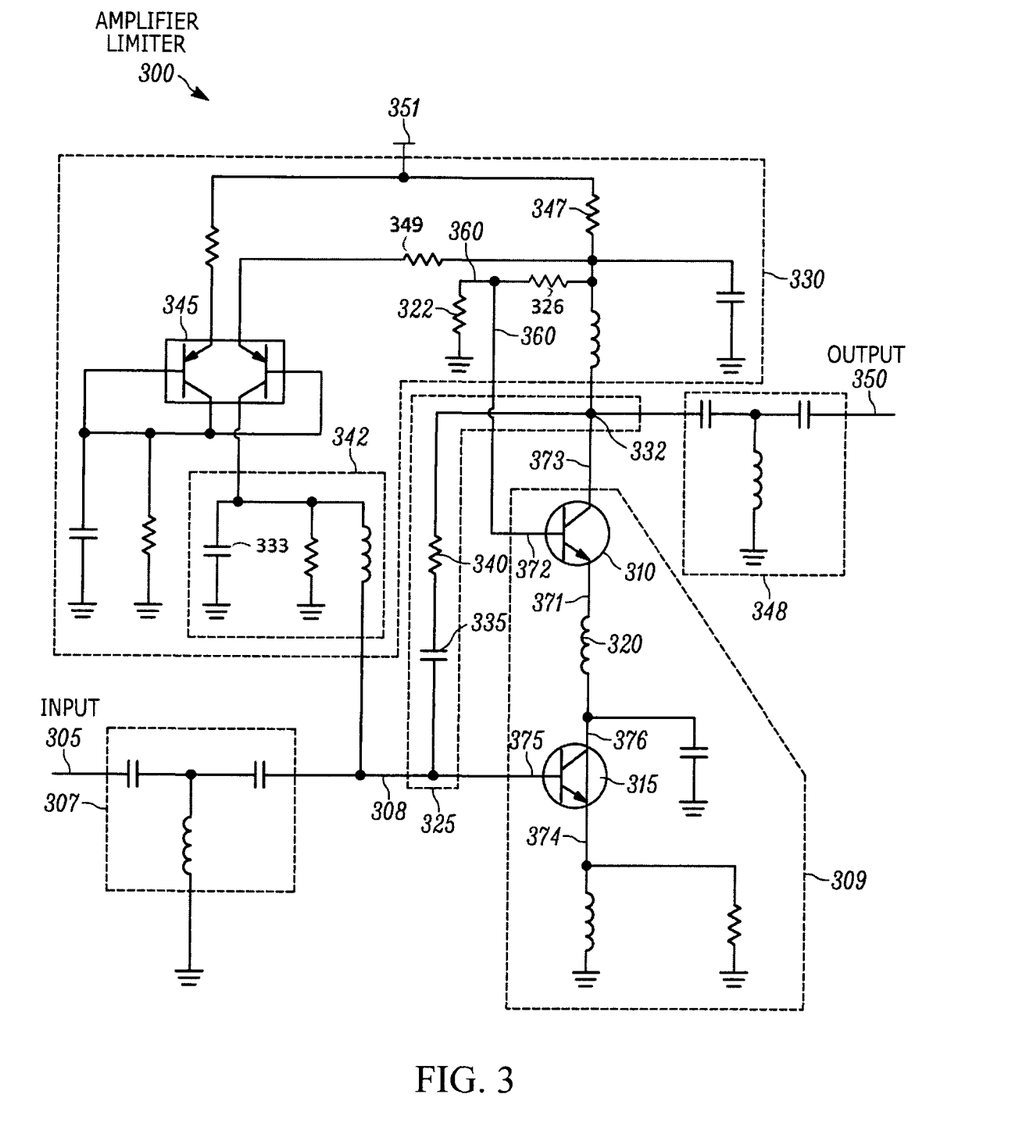
FIG. 3 illustrates a schematic diagram of an amplifier limiter of the land mobile radio according to one embodiment.

FIG. 3 illustrates a circuit diagram of the amplifier limiter 215 according to one embodiment. As illustrated, the amplifier limiter 215 is a dual-feedback low-noise amplifier (LNA) limiter. The amplifier limiter 215 is used to increase the range performance of the land mobile radio 105 by improving sensitivity performance (i.e., improved signal-to-noise ratio) and providing increased small signal linearity characteristics (i.e., third, fifth, and seventh order intermodulation and spurious rejection) while simultaneously providing a means of progressively compressing/limiting an output signal of the amplifier limiter to a predefined output level. A radio-frequency signal is received at an input 305 of the amplifier limiter 215. For example, the input 305 may be coupled to the antenna 212 as shown in FIG. 2. The radio-frequency signal is routed through a first radio-frequency matching network 307 and then provided to an input node 308 of a stacked amplifier 309 (i.e., a two-stage amplifier). The stacked amplifier 309 includes two bipolar junction transistors (BJTs) that act as amplifiers and are coupled in a stacked configuration.

In particular, the stacked amplifier 309 includes a first transistor 310, configured as a common-base amplifier, and a second transistor 315, configured as a common-emitter amplifier. The first transistor 310 is also referred to as the common-base amplifier 310 and the second transistor 315 is also referred to as the common-emitter amplifier 315. The common-base amplifier 310 includes an emitter 371, a base 372, and a collector 373. The common-emitter amplifier 315 includes an emitter 374, a base 375, and a collector 376. As shown in FIG. 3, the emitter 371 of the common-base amplifier 310 is coupled to the collector 376 of the common-emitter amplifier 315 through an inductor 320. In other embodiments, the common-base amplifier 310 may be coupled to the common-emitter amplifier 315 directly, through a resistor, or through a combination of components including at least a resistor and an inductor. A biased radio-frequency signal (as explained in greater detail below) is provided to the stacked amplifier 309 by the input node 308, which is coupled to the base 375 of the common-emitter amplifier 315. The common-base amplifier 310 also functions as a limiter and a buffer. For example, the common-base amplifier 310 functions as a unity gain buffer and may set a collector voltage level of the common-emitter amplifier 315. Fixing the collector voltage of the common-emitter amplifier 315 reduces the Miller effect on the common-emitter amplifier 315, which allows for higher gain and linearity to be realized. This improved linearity also improves control of the quiescent current, power saturation, and transient behavior when strong radio-frequency signals are received at the input 305.

In particular, as radio-frequency signals received by the input 305 increase, the radio-frequency energy at the base 372 of the common-base amplifier 310 re-biases the common-emitter amplifier 315 so as to limit the effective gain provided by the stacked amplifier 309. This reduction in gain reduces the Miller effect for the common-emitter amplifier 315 (i.e., $C_M = C(1+A_v)$ where $C_M$ is the effective Miller capacitance, C is feedback capacitance, and $A_v$ is the stacked amplifier 305 gain). As the common-base amplifier gain is reduced when the common-base amplifier 310 begins to compress, the system noise and linearity naturally tends to degrade. However, the envelope control feedback circuit 330 actively re-biases the base 375 of the common-emitter amplifier 315 so as to mitigate systemic degradations in noise and linearity that would normally be introduced as the common-base amplifier 310 is compressed. In this manner, improved noise figure and linearity may be maintained in divergent operating conditions (i.e., for both weak and strong radio-frequency signals received by the input 305). Selection of the values of the elements in a reactive element loop filter 342, specifically a capacitor 333, allows improved noise figure and linearity performance of the stacked amplifier 309 when strong radio-frequency signals are received by the input 305. For example, a smaller capacitor can enable a faster response time by the envelope control feedback circuit 330. Additionally, the size of the capacitor 333 can modify the bandwidth of the envelope control feedback circuit 330.

The amplifier limiter 215 further includes dual feedback through a radio-frequency feedback circuit 325 and an envelope control feedback circuit 330. The radio-frequency feedback circuit 325 is coupled to the input node 308 and an output node 332 of the stacked amplifier 309. Such a configuration may be referred to as global radio-frequency feedback. In some embodiments, the radio-frequency feedback circuit 325 is coupled to the emitter 371 of the common-base amplifier 310 instead of the output node 332. Such a configuration is referred to as local radio-frequency feedback. The radio-frequency feedback circuit 325 includes a passive radio-frequency dependent reactive element (i.e., capacitor 335) in series with a radio-frequency feedback circuit resistor (i.e., resistor 340). For example, the resistor 340 may be a passive radio-frequency agnostic resistor. The radio-frequency feedback circuit 325 is used to linearize the radio-frequency signal received by the input 305.

The envelope control feedback circuit 330 is coupled to the input node 308 and the output node 332 of the stacked amplifier 309. The envelope control feedback circuit 330 includes the reactive element loop filter 342, two transistors that are configured to be a current mirror 345, and a bias resistor 347. The envelope control feedback circuit 330 also includes other resistors, capacitors, and inductors as shown in FIG. 3 for providing the desired feedback to the input node 308.

The envelope control feedback circuit 330 detects an envelope of the radio-frequency signal and uses the envelope to control the current provided to the base 375 of the common-emitter amplifier 315. The envelope control feedback circuit 330 maintains a near constant current to the base 375 of the common-emitter amplifier 315 regardless of the strength of the radio-frequency signal received at the input 305 notwithstanding fluctuations due to the radio frequency signal received at the input 305. More specifically, the envelope control feedback circuit 330 provides a bias voltage to the input node 308 to control the current provided to the base 375 of the common-emitter amplifier 315. Accordingly, this bias voltage provides the biased radio-frequency signal at input node 308 to the base 375 of the common-emitter amplifier 315. In particular, the voltage drop across the bias resistor 347 serves as the input to the current mirror 345 of the envelope control feedback circuit 330 and controls the available bias to the base 375 of the common-emitter amplifier 315. Current scaling by the current mirror 345 is set by the resistive ratio between resistor 347 and resistor 349. The envelope control feedback circuit 330 attempts to maintain a desired constant voltage across bias resistor 347. When the strength of the radio-frequency signal received at the input 305 is increased, an increase in biasing current through the base 375 of the common-emitter amplifier 315 occurs. In turn, the current passing through the collector 376 of the common-emitter amplifier 315 increases, which results in a higher voltage across the bias resistor 347. Accordingly, the envelope control feedback circuit 330 lowers the biasing current through the input node 308 (and provided to the base 375 of the common-emitter amplifier 315) until the voltage across the bias resistor 347 returns back to the desired constant voltage.

When there is a sudden change in radio-frequency input level received at the input 305, the envelope control feedback circuit 330 ensures that the current provided to the base 375 of the common-emitter amplifier 315 changes quickly and smoothly to maintain the quiescent current flowing through the common-emitter amplifier 315 and the common-base amplifier 310. For example, because a strong radio-frequency signal received at the input 305 may be sufficient itself to fully or partially self-bias the common-emitter amplifier 315, the size of the capacitors in the envelope control feedback circuit 330 are small enough to allow the envelope control feedback circuit 330 to quickly adjust the bias current. Furthermore, limiting the current provided to the base 375 of the common-emitter amplifier 315 prevents the common-emitter amplifier 315 from draining excessive current. For example, for a high current that causes the common-emitter amplifier 315 to operate in the saturation region, the radio-frequency signal may experience amplitude saturation (i.e., clipping). However, even when the radio-frequency signal experiences amplitude saturation, phase information of the radio-frequency is preserved which allows frequency modulation and other constant envelope modulation schemes to pass through the amplifier limiter 215.

From the output node 332, a conditioned radio-frequency signal is passed through a second radio-frequency matching network 348 and then provided to an output 350 of the amplifier limiter 215. The output 350 may be coupled to elements of the receiving circuitry 220 such as a single conversion receiving integrated circuit or a power amplifier.

In the embodiment shown in FIG. 3, the base 372 of the common-base amplifier 310 is coupled to ground through a non-capacitive circuit path 360 that solely includes a resistor 322. The non-capacitive circuit path 360 from the base 372 of the common-base amplifier 310 to ground is non-capacitive in that the path 360 does not include a capacitor. The non-capacitive circuit path 360 from the base 372 of the common-base amplifier 310 to ground may have some minimal, inherent capacitive properties, but remains a non-capacitive path because it lacks a discrete capacitive element. In contrast, providing a capacitor, for instance, in parallel with the resistor 322 would render the path 360 from the base 372 of the common-base amplifier 310 a capacitive path. In contrast to a capacitive path, the non-capacitive path 360, forces the base 372 of the common-base amplifier 310 to a fixed direct current bias using resistors 322 and 326 while allowing the radio-frequency signal at the base 372 of the common-base amplifier 310 to remain. In combination with the envelope control feedback circuit 330 (as explained in previous paragraphs), the non-capacitive path 360, allows a radio-frequency signal at the base 372 of the common-base amplifier 310 to self-bias the common-emitter amplifier 315 dynamically (and gradually) so as to reduce the gain of the stacked amplifier 309. In some embodiments, the non-capacitive circuit path 360 between the base 372 of the common-base amplifier 310 and ground includes a combination of components that includes at least a resistor and an inductor.

Figure 4A:
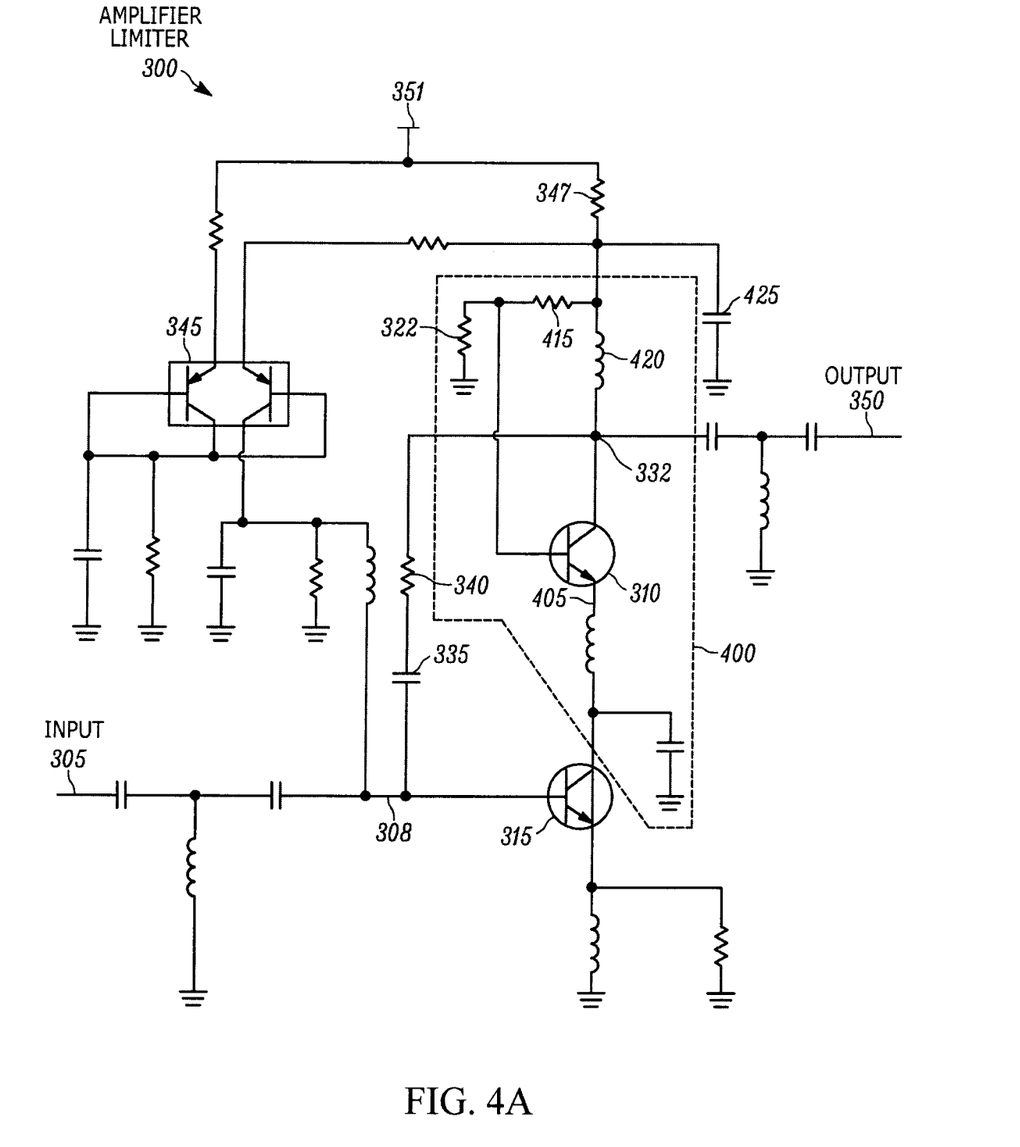
FIGS. 4A and 4B illustrate a schematic diagram of the amplifier limiter and a simplified equivalent circuit.
Figure 4B:
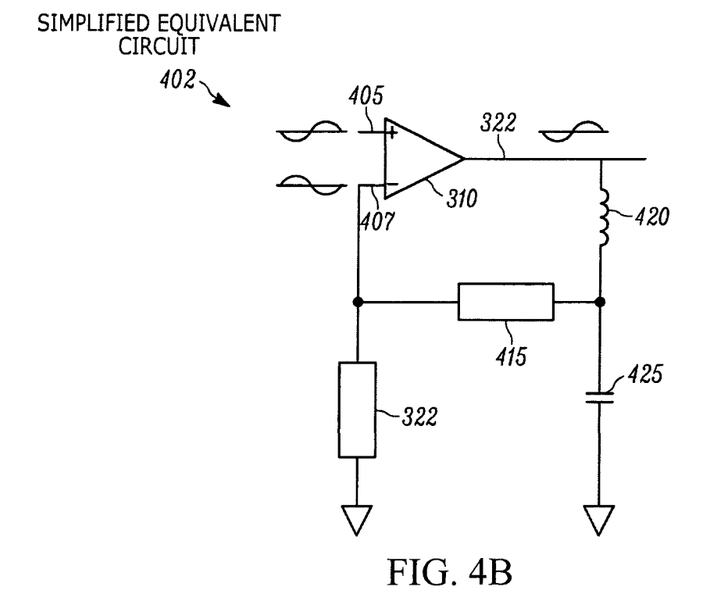

FIGS. 4A and 4B illustrate a schematic diagram of the amplifier limiter 215 and a simplified equivalent circuit 402. FIG. 4A shows the schematic of the amplifier limiter 215 with various components of the amplifier limiter 215 outlined by dashed lines 400. FIG. 4B shows the simplified equivalent circuit 402 of the outlined components of FIG. 4A. As shown by FIG. 4B, the common-base amplifier circuit may be simplified into an equivalent circuit 402 that includes an operational amplifier (op amp) that corresponds to the common-base amplifier 310. In the simplified equivalent circuit 402, the positive terminal of the operational amplifier is coupled to an emitter voltage 405 of the common-base amplifier 310. The negative terminal of the operational amplifier corresponds to a voltage 407 from the base 372 to the emitter 371 of the common-base amplifier 310. The output of the operational amplifier corresponds to the voltage at the output node 332 of the stacked amplifier 309. Additionally, remaining components of the simplified equivalent circuit 402 are labeled similarly as the corresponding components of FIG. 4A. For example, the simplified equivalent circuit 402 further includes the resistor 322 as well as resistor 415, inductor 420, and capacitor 425.

As shown near the inputs and output of the operational amplifier in FIG. 4B, the voltage at the output node 332 and the emitter voltage 405 of the common-base amplifier 310 are in phase with each other and have approximately zero decibel gain. On the other hand, the voltage 407 from the base 372 to the emitter 371 of the common-base amplifier 310 is anti-phase with the voltage at the output node 332 and the emitter voltage 405 of the common-base amplifier 310.

Figure 5A:
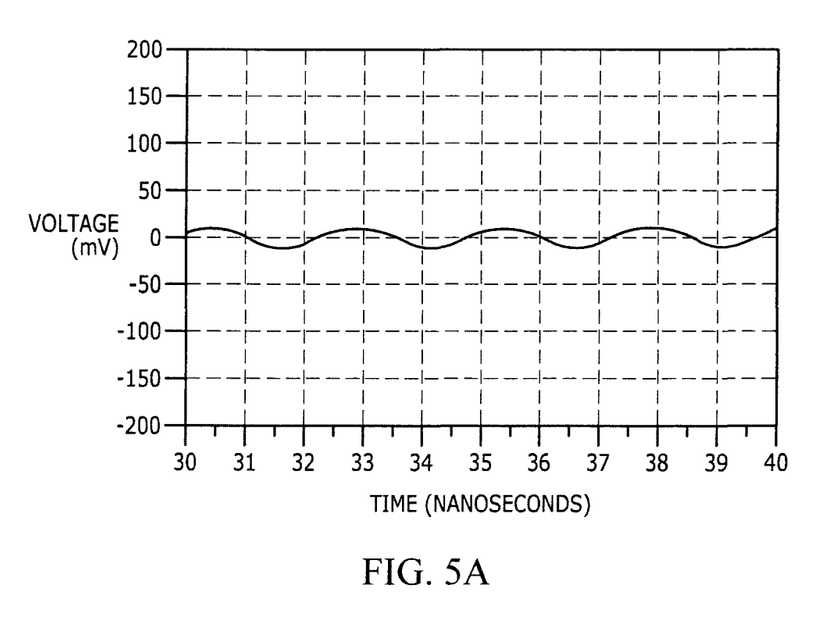
FIGS. 5A, 5B, 5C, 5D, and 5E illustrate an exemplary radio-frequency signal as it passes through the amplifier limiter.
Figure 5B:
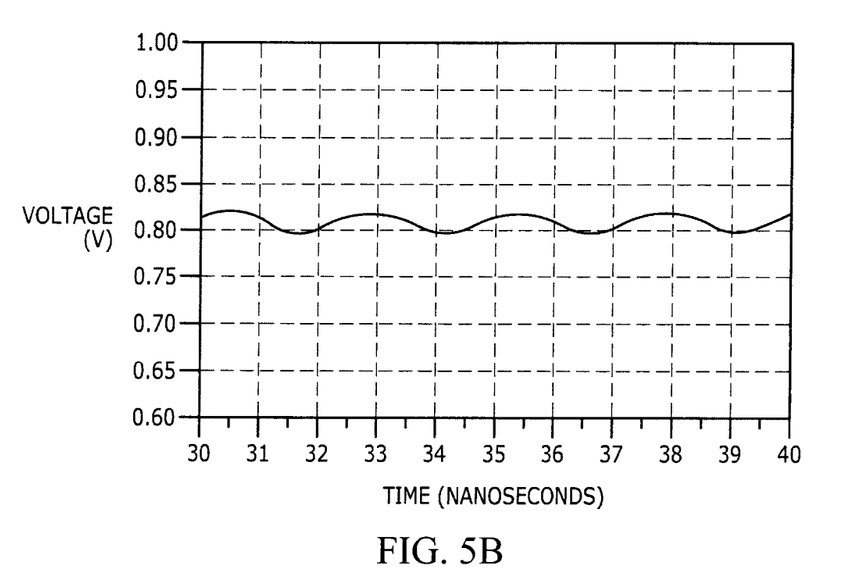

FIGS. 5A through 5E illustrate an exemplary radio-frequency signal as it passes from the input 305 to the output 350 of the amplifier limiter 215. As shown in FIG. 5A, the radio-frequency signal is received at the input 305 and has an amplitude of approximately ten millivolts. The radio-frequency signal then passes through the first radio-frequency matching network 307 and is provided to the input node 308. At the input node 308, the biased radio-frequency signal is provided to the base 375 of the common-emitter amplifier 315 at the input node 308. As shown in FIG. 5B, the voltage from the base 375 to the emitter 374 of the common-emitter amplifier 315 (i.e., the biased radio-frequency signal) has the same frequency of the radio-frequency signal received at the input 305. However, due to the envelope control feedback circuit 330 and the radio-frequency feedback circuit 325, the signal in FIG. 5B has been biased to have a direct current offset of approximately 800 millivolts (i.e., the cut-in voltage of the common-emitter amplifier 315).

Figure 5C:
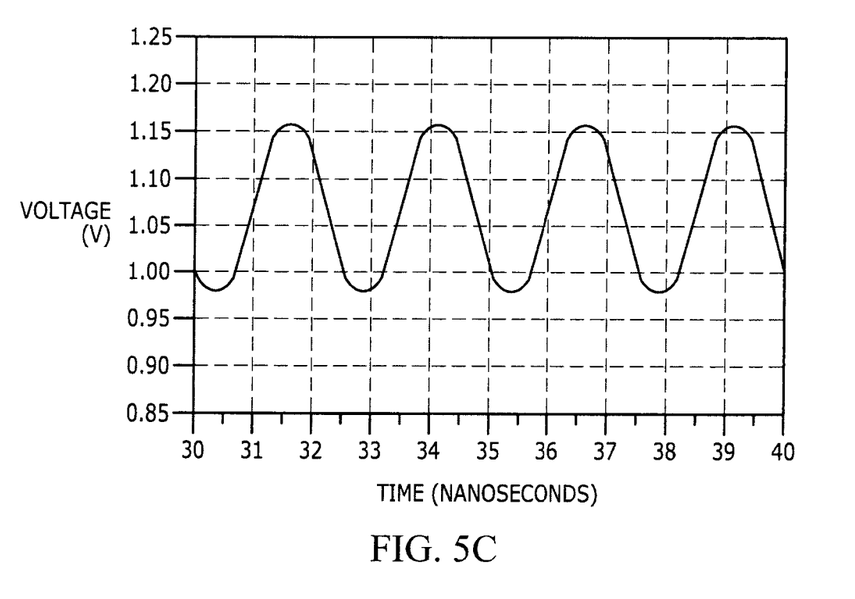
Figure 5D:
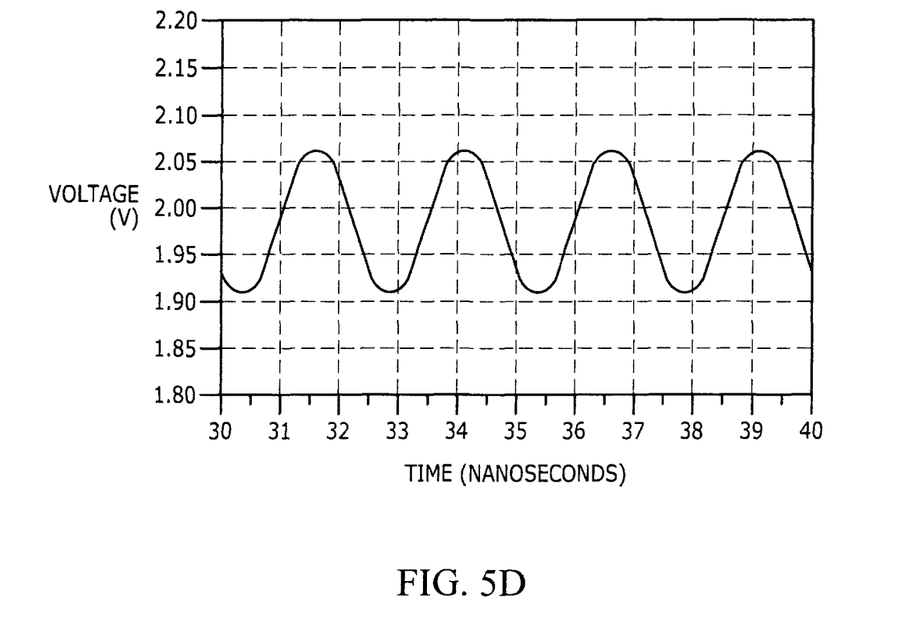
Figure 5E:
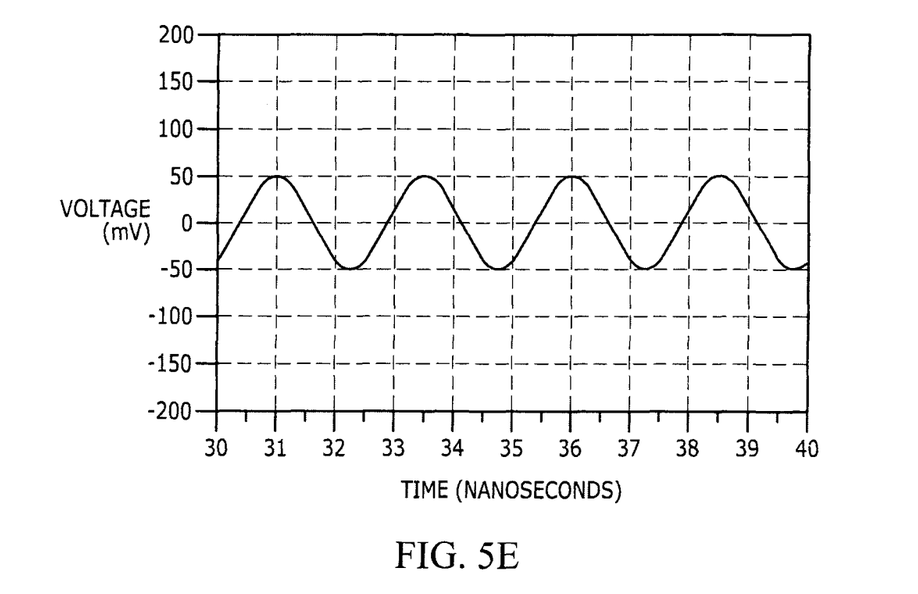

FIG. 5C illustrates a voltage signal at the emitter 371 of the common-base amplifier 310. As shown in FIG. 5C, the signal is inverted with respect to the signal shown in FIG. 5B. Additionally, the signal in FIG. 5C has been amplified to have an amplitude approximately five times larger than the signal shown in FIG. 5B. FIG. 5D illustrates a voltage at the output node 332 (i.e., the conditioned radio frequency signal). As shown in FIG. 5D, the frequency and amplitude of the conditioned radio-frequency signal remain unchanged with respect to the signal shown in FIG. 5C. FIG. 5E illustrates a voltage at the output 350 of the amplifier limiter 215 after the conditioned radio-frequency signal passes through the second radio-frequency matching network 348. The conditioned radio-frequency signal at the output 350 is further conditioned to remove the direct current offset introduced by the feedback circuits 325 and 330 as well as to reduce the amplitude of the signal to approximately fifty millivolts.

Figure 6:
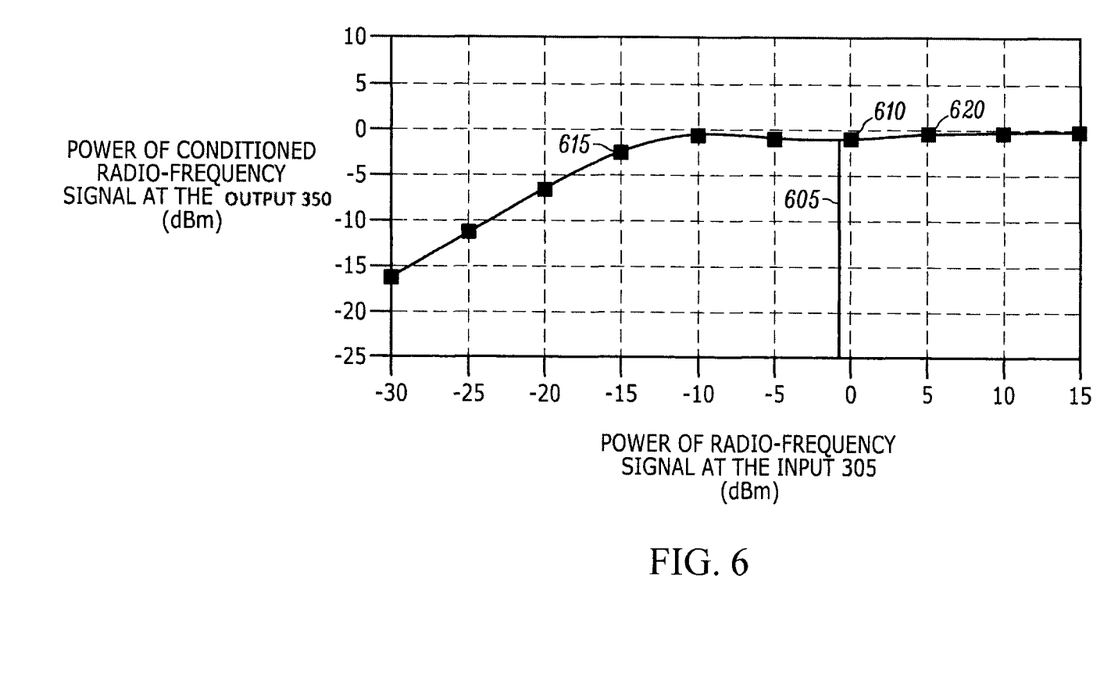
FIG. 6 illustrates a graph comparing the power of a radio-frequency signal received by an input of the amplifier limiter of FIG. 3 to the power of a conditioned radio-frequency signal provided at an output of the amplifier limiter.

Thus, from the input 305 to the output 350 of the amplifier limiter 215, the exemplary ten millivolt input signal is amplified to a fifty millivolt output signal. The radio-frequency signal shown in FIGS. 5A through 5E is merely exemplary. The strength of the radio-frequency signal received by the input 305 of the amplifier limiter 215 may vary. FIG. 6 illustrates a graph comparing the power of the radio-frequency signal received by the input 305 to the power of the conditioned radio-frequency signal provided at the output 350 of the amplifier limiter 215. As shown in FIG. 6, the amplifier limiter 215 amplifies received radio-frequency signals below a predetermined threshold 605. In FIG. 6, the predetermined threshold 605 is slightly less than zero decibel-milliwatts (dBm). At the predetermined threshold 605, the amplifier limiter 215 has zero net gain (i.e., the power of the received radio-frequency signal is approximately the same as the conditioned radio-frequency signal provided at the output 350).

The strength of the received radio-frequency signal represented by point 610 in FIG. 6 is approximately equal to the predetermined threshold 605. Accordingly, the amplifier limiter 215 does not amplify or compress the conditioned radio-frequency provided at the output 350 as indicated by FIG. 6. The strength of the received radio-frequency signal represented by point 615 in FIG. 6 is less than the predetermined threshold 605. Accordingly, the amplifier limiter 215 amplifies the conditioned radio-frequency provided at the output 350 as indicated by FIG. 6. The strength of the received radio-frequency signal represented by point 620 in FIG. 6 is greater than the predetermined threshold 605. Accordingly, the amplifier limiter 215 compresses/limits the conditioned radio-frequency provided at the output 350 as indicated by FIG. 6.

Figure 7A:
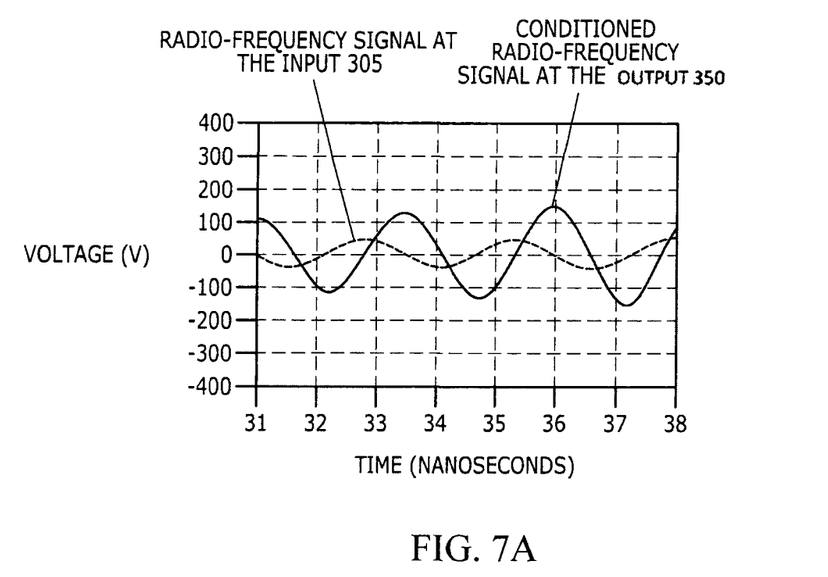
FIG. 7A illustrates the relationship between input and output voltage of the amplifier limiter of FIG. 3 when the amplifier limiter is operating at the edge of a linear region (i.e., before limiting/compression occurs).
Figure 7B:
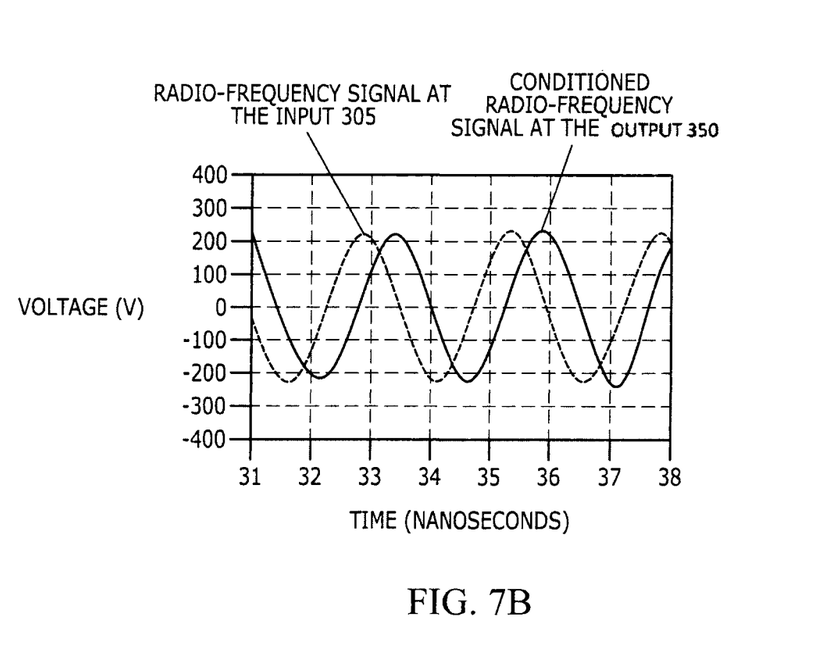
FIG. 7B illustrates the input and output voltage of the amplifier limiter of FIG. 3 when the amplifier limiter has unity gain.
Figure 7C:
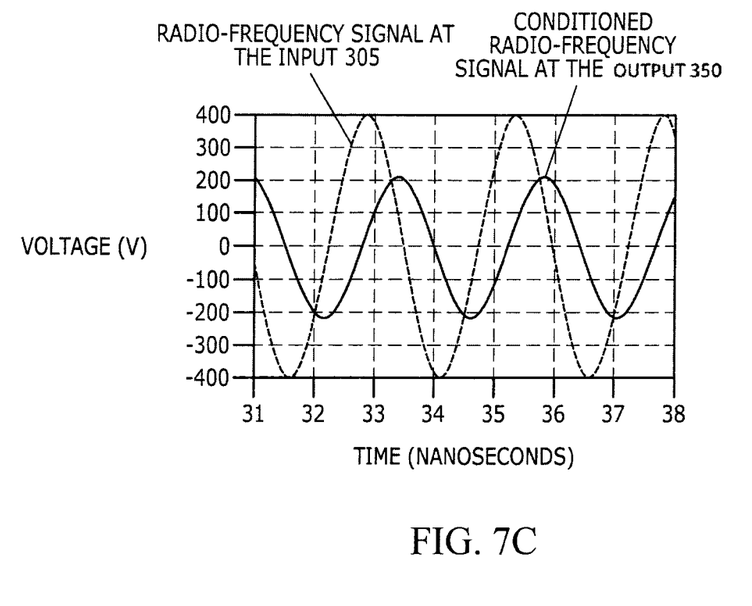
FIG. 7C illustrates the input and output voltage of the amplifier limiter of FIG. 3 when the amplifier limiter is attenuating the radio-frequency signal received by the input by a factor of two times.

FIGS. 7A, 7B, and 7C correspond to the radio-frequency signals represented by points 615, 610, and 620, respectively. As shown in FIG. 7A, because the strength of the radio-frequency signal received by the input 305 is below the predetermined threshold 605 (see point 615 in FIG. 6), the conditioned radio-frequency signal provided at the output 350 has a larger amplitude compared to that of the radio-frequency signal received at the input 305. As shown in FIG. 7B, because the strength of the radio-frequency signal received by the input 305 is approximately equal to the predetermined threshold 605 (see point 610 in FIG. 6), the conditioned radio-frequency signal provided at the output 350 has approximately the same amplitude as the radio-frequency signal received by the input 305. As shown in FIG. 7C, because the strength of the radio-frequency signal received by the input 305 is greater than the predetermined threshold 605 (see point 620 in FIG. 6), the conditioned radio-frequency signal provided at the output 350 has a smaller amplitude compared to that of the radio-frequency signal received at the input 305.

Accordingly, the amplifier limiter 215 provides a conditioned radio-frequency signal that relates to the radio-frequency signal received at the input 305 to elements of the receiving circuitry 220 such as a single conversion receiving integrated circuit or a power amplifier for use on the land mobile radio 105.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has," "having," "includes," "including," "contains," "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a," "has . . . a," "includes . . . a," or "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially," "essentially," "approximately," "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Moreover, an embodiment can be implemented as a computer-readable storage medium having computer readable code stored thereon for programming a computer (e.g., comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter

The invention claimed is:

1. A dual-feedback, amplifier limiter for providing a conditioned radio-frequency signal, comprising:
   an input that receives a radio-frequency signal;
   a stacked amplifier including an input node coupled to the input, an output node, a first transistor configured as a common-base amplifier, and a second transistor configured as a common-emitter amplifier;
   an output coupled to the output node of the stacked amplifier, the output providing, from the stacked amplifier, the conditioned radio-frequency signal;
   a radio-frequency feedback circuit coupled to the stacked amplifier, said radio-frequency feedback circuit including a passive radio-frequency dependent reactive element in series with a radio-frequency feedback circuit resistor; and
   an envelope control feedback circuit coupled to the stacked amplifier and including a current mirror and a reactive element loop filter coupled to the current mirror and the input node.

2. The dual-feedback, amplifier limiter of claim 1, wherein a base of the first transistor is coupled to ground through a non-capacitive circuit path.

3. The dual-feedback, amplifier limiter of claim 2, wherein the non-capacitive circuit path includes at least one selected from a group consisting of a resistor and an inductor.

4. The dual-feedback, amplifier limiter of claim 1, wherein the radio-frequency feedback circuit is coupled to a collector of the first transistor and a base of the second transistor.

5. The dual-feedback, amplifier limiter of claim 1, wherein the radio-frequency feedback circuit is coupled to an emitter of the first transistor and a base of the second transistor.

6. The dual-feedback amplifier limiter of claim 1, wherein the envelope control feedback circuit is coupled to
   a base of the second transistor; and
   a collector of the first transistor through a bias resistor.

7. The dual-feedback amplifier limiter of claim 1, wherein
   a base of the second transistor is coupled to the input node and receives a biased radio-frequency signal;
   a collector of the second transistor is coupled to an emitter of the first transistor; and
   a collector of the first transistor is coupled to the output node and provides the conditioned radio-frequency signal to the output.

8. The dual-feedback amplifier limiter of claim 7, wherein the collector of the second transistor is coupled to the emitter of the first transistor through at least one selected from a group consisting of a resistor and an inductor.

9. The dual-feedback amplifier limiter of claim 1, wherein the radio-frequency signal passes through a first radio-frequency matching network prior being provided to the input node.

10. The dual-feedback amplifier limiter of claim 9, wherein a second radio-frequency matching network is provided between the output node and the output.

11. The dual-feedback amplifier limiter of claim 1, wherein the envelope control feedback circuit includes a bias resistor that serves as an envelope control feedback circuit input and controls a bias available to a base of the common-emitter amplifier.

12. The dual-feedback amplifier limiter of claim 1, wherein the passive radio-frequency dependent reactive element is a capacitor.

13. The dual-feedback amplifier limiter of claim 1, wherein the radio-frequency feedback circuit and the envelope control feedback circuit control a current to a base of the common-emitter amplifier such that the radio-frequency signal is compressed when a strength of the radio-frequency signal is above a predetermined threshold.

14. A method of providing a conditioned radio-frequency signal, comprising:
   receiving a radio-frequency signal at an input;
   providing the radio-frequency signal at an input node of a stacked amplifier that includes a common-base amplifier and a common-emitter amplifier;
   providing feedback, at the input node, from a radio-frequency feedback circuit and an envelope control feedback circuit to bias the radio-frequency signal to provide a biased radio-frequency signal to the stacked amplifier;

conditioning the radio-frequency signal, using the stacked amplifier, to produce the conditioned radio-frequency signal; and transmitting the conditioned radio-frequency signal to receiving circuitry at an output;

wherein providing feedback from the envelope control feedback circuit includes providing the conditioned radio-frequency signal to a bias resistor, a current mirror, and a reactive element loop filter coupled to the current mirror and the input node.

15. The method of claim 14, wherein providing feedback from the radio-frequency feedback circuit includes providing the conditioned radio-frequency signal to a passive radio-frequency dependent reactive element in series with a radio-frequency feedback circuit resistor.

16. The method of claim 14, further comprising providing the radio-frequency signal to a first radio-frequency matching network prior to providing the radio-frequency signal to the input node.

17. The method of claim 16, further comprising providing the conditioned radio-frequency signal to a second radio-frequency matching network before transmitting the conditioned radio-frequency signal to the receiving circuitry at the output.

18. The method of claim 14, wherein providing feedback includes controlling a current to a base of the common-emitter amplifier such that the radio-frequency signal is compressed when a strength of the radio-frequency signal is above a predetermined threshold.

\* \* \* \* \*